United States Patent [19]

Stanchina et al.

[11] Patent Number: 5,532,486

[45] Date of Patent: Jul. 2, 1996

[54] HETEROJUNCTION DIODE WITH LOW TURN-ON VOLTAGE

[75] Inventors: William E. Stanchina, Thousand Oaks, Calif.; Robert A. Metzger, Atlanta, Ga.; David B. Rensch, Thousand Oaks, Calif.

[73] Assignee: Hughes Aircraft Company, Los Angeles, Calif.

[21] Appl. No.: 387,507

[22] Filed: Feb. 13, 1995

[51] Int. Cl.$^6$ .............................................. H01L 31/0328
[52] U.S. Cl. .......................... 257/201; 257/197; 257/200; 257/472; 257/916
[58] Field of Search ..................................... 257/201, 200, 257/197, 449, 472, 912, 916

[56] References Cited

U.S. PATENT DOCUMENTS

| | | |
|---|---|---|
| 4,198,644 | 4/1980 | Esaki ........................................ 257/201 |
| 4,807,006 | 2/1989 | Rogers et al. .......................... 257/449 |
| 5,049,522 | 9/1991 | Stanchina et al. . |

OTHER PUBLICATIONS

Woodcock et al. "Control of the Height of Schottky Barriers on MBE GaAs", *Electronics Letters*, vol. 19, No. 3, 3 Feb. 1983, pp. 93–95.

Eglash et al., "Barrier Heights from ohmic to Bandgap: Modified Al:GaAs Schottky Diodes by MBE", *Proc. Int'l Electron Devices Meeting*, Dec. 1983, pp. 119–122.

Ferry, ed., *Gallium Arsenide Technology*, Howard W. Sams & Co. Dec. 1985, pp. 303–330 and 376–382.

Sze, *Physics of Semiconductor Devices*, 2d, Ed., John Wiley & Sons, 1981, pp.182–184, 350, 706–715, 763–765 and 780–783.

*Primary Examiner*—Edward Wojciechowicz
*Attorney, Agent, or Firm*—V. D. Duraiswamy; W. K. Denson-Low

[57] ABSTRACT

A high speed diode with a low forward-bias turn-on voltage is formed by a heterojunction between a layer of doped semiconductor material that has a narrow bandgap energy of not more than about 0.4 eV, and a layer of oppositely doped semiconductor material that has a substantially wider bandgap energy. The device operates with a lower turn-on voltage than has previously been attainable, despite lattice mismatches between the two materials that can produce strain and substantial lattice dislocations in the low bandgap material. The two materials are selected so that the valence and conduction band edge discontinuities at the heterojunction enable a forward carrier flow but block a reverse carrier flow across the junction under forward-bias conditions. Preferred material systems are InAs for the narrow bandgap material, InGaAs for the wider bandgap material and InP for the substrate, or AlSb for the wider bandgap material and GaSb for the substrate. A compositional grading can be provided at the heterojunction to reduce energy band spikes, and a region of low dopant concentration is included in the wider bandgap material to increase the diode's reverse-bias breakdown voltage.

21 Claims, 3 Drawing Sheets

SCHOTTKY DIODE

HBT

HJFET

STAIRCASE APD

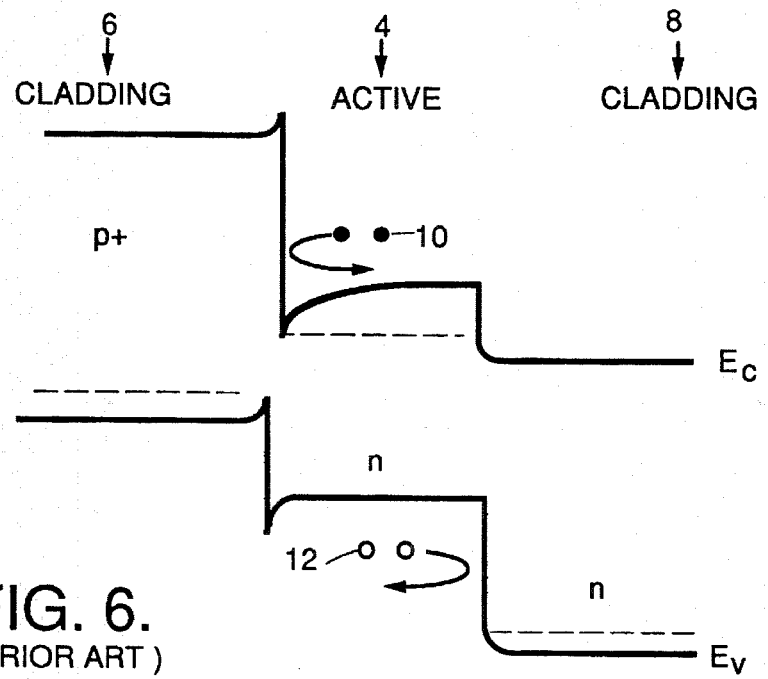
FIG. 6.
(PRIOR ART)
LASER
FIG. 7.
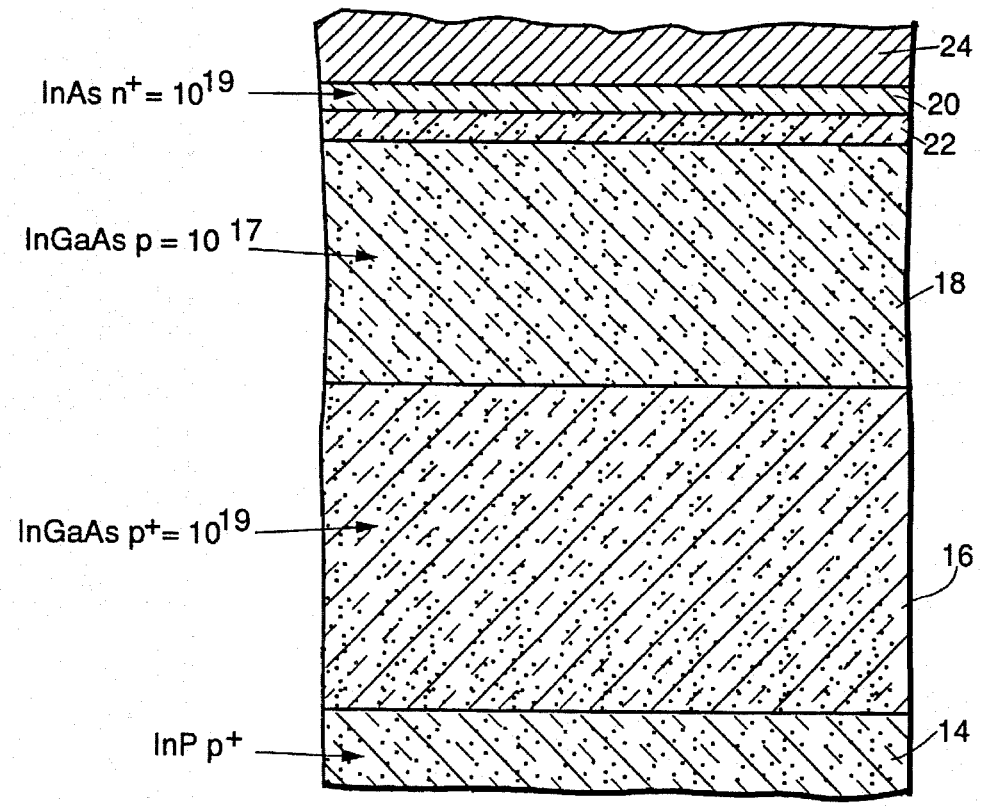

HETEROJUNCTION DIODE WITH LOW TURN-ON VOLTAGE

BACKGROUND OF THE INVENTION

1. Field of the Invention

This invention relates to electrical diodes, and more particularly to a heterojunction diode with a low turn-on voltage.

2. Description of the Related Art

While an "ideal" diode will become fully conductive under an extremely small forward bias voltage, practical diodes exhibit a significant forward-bias turn-on voltage. Diodes with smaller turn-on voltages would be highly desirable for applications such as compact, efficient power supplies for vehicles, satellites, radar and computer systems.

The diode that has exhibited the lowest turn-on voltage so far is a variation of the Schottky diode, in which a narrow layer of n+ GaAs is fabricated at the junction of a conventional metal/semiconductor device. This type of diode is described in Woodcock et al., "Control of the Height of Schottky Barriers on MBE GaAs", *Electronics Letters*, Vol. 19, No. 3, Feb. 3, 1983, pages 93–95, and Eglash et al., "Barrier Heights from Ohmic to Bandgap: Modified Al:GaAs Schottky Diodes by MBE", *Proc., Int'l. Electron Devices Meeting*, 1983, pages 119–122. The reported devices, with their associated turn-on voltages, include Au on GaAs (0.60 V), Al on GaAs (0.38 V), Ni on Si (0.36 V), Ni on GaAs (0.30 V) and Au on InP (turn-on voltage not reported, but energy barrier height was 0.50 eV, as compared to 0.57 eV for Ni on GaAs).

The modified Schottky diodes operate by reducing the differential between the conductive band energies of the metal and semiconductor at the junction ($\phi_B$). This is illustrated in FIG. 1, which is an energy diagram in the vicinity of a junction 2 between a metal and a doped semiconductor, illustrated as n-doped GaAs. The semiconductor's conduction band energy $E_c$ peaks at the junction, with $\phi_B$ defined as the differential between $E_c$ and the metal's conduction band energy or Fermi energy, Eg. The references demonstrate that the insertion of a p+ layer on the semiconductor side of the junction can be used to increase the $\phi_B$ Schottky barrier height, and an n+ layer can be used to lower it. Reductions in the forward-bias turn-on voltage, down to a minimum of about 0.3 volts, can be accomplished in this manner. The n+ layer is formed from the same semiconductor as the n-doped material, and is simply given a heavier doping. While this reduction in turn-on voltage is helpful, still lower turn-on voltages would be highly desirable.

The Schottky diodes that were initially discussed above are presently used for high-speed power supply converters because they are majority carrier devices, with little minority carrier recombination. GaAs Schottky diodes have been found to offer the highest speed performance because of their transport properties. Although connecting multiple diodes in parallel to obtain a lower diode current density, with a correspondingly lower turn-on voltage, has been done in the past, this is not practical where circuit speed is a concern, since it also reduces the device's operating speed and prevents compact designs. System requirements for a diode with both a very low turn-on voltage and a high speed capability cannot be satisfied by available devices.

Various kinds of heterojunction devices have also been investigated over the past few decades. A heterojunction is a junction formed between two dissimilar semiconductors. Applications for heterojunctions that are of interest for the present invention include heterojunction bipolar transistors (HBTs), heterojunction field effect transistors (HJFETs), avalanche photodetectors (APDs) and lasers. Such devices are described in Ferry, ed., *Gallium Arsenide Technology*, Howard W. Sams & Co. 1985, pages 303–330 and 376–382, and Sze, *Physics of Semiconductor Devices*, 2d. Ed., John Wiley & Sons, 1981, pages 182–184, 350, 706–715, 763–765 and 780–783; a general heterojunction model is described in the Sze text at pages 122–129. Such devices are pertinent to the present invention in that they include heterojunction diodes imbedded within their overall structures.

A representative energy diagram for the emitter and base of a HBT is given in FIG. 2. The emitter is formed from a material having a relatively wide bandgap energy between its conduction and valence bands, while the base material has a narrower bandgap energy. The collector, which is not shown, can be formed from the same material as either the emitter or the base.

It is important that there be a close lattice matching between the emitter and base, to avoid a strain in the base that could otherwise generate lattice dislocations (crystalline defects). Such dislocations establish carrier recombination centers, and greatly reduce the device's gain. For emitter material such as AlGaAs or GaInP, a suitable lattice-matched base material is GaAs; for an InP or AlInAs emitter, a suitable lattice-matched base material is InGaAs. GaAs has a bandgap energy Eg of 1.4 eV, while InGaAs has an Eg of 0.75 eV. At these bandgap energy levels, the emitter-base junction would exhibit a forward-bias turn-on voltage greater than the 0.3 volts achieved with the modified Schottky diode described above, if it were isolated from the remainder of the HBT.

The generation of undesirable lattice dislocations is a function not only of the absolute lattice mismatch between the two materials, but also of the thickness of the material that is grown (typically epitaxially) upon the other material. As the thickness of the grown material increases, a lower lattice mismatch is required to generate dislocations. This phenomenon is illustrated in principle in FIG. 3, which presents a representative Matthews-Blakeslee curve comparing lattice mismatch with the thickness required to form dislocations. It can be seen that higher degrees of lattice mismatch can be tolerated if the grown layer is made thin enough. In the case of the HBT base material described above, for example, a lattice mismatch on the order of about 3% can be tolerated without the generation of dislocations in the base, but only if the base layer is restricted to a thickness on the order of tens of Angstroms. However, this is too thin for a practical HBT base. A base this thin would likely be fully depleted of charge carriers, without being able to establish the necessary charge-neutral region. Even if a charge-neutral region could be achieved, it would be so thin that its resistance would be too high. Thus, the choice of materials for the emitter-base junction in an HBT is quite restricted.

An example of an HJFET device would be one with an n-type InP channel and a p+ InGaAs gate; an energy diagram of the gate-channel junction is illustrated in FIG. 4. Since electron conduction is the dominant conduction mechanism, when considered as a diode in isolation the turn-on voltage of the gate-channel junction is determined by the bandgap energy of the conduction bands. The holes are typically avoided as the dominant conduction mechanism, since they are relatively slow. $In_{0.53}Ga_{0.47}As$ is lattice matched with InP, and has a bandgap energy on the order of 0.75 eV. Again, if considered in isolation the gate-channel junction would have a forward-bias turn-on voltage considerably in excess of 0.3 volts.

Typical APDs have both a pn junction and a heterojunction, but they are at different locations within the device; the pn junction itself is a homojunction. However, "staircase" APDs do employ a pn heterojunction, typically with p-type AlGaAs on one side of the junction and n-type GaAs on the other; these materials are well lattice matched to each other. An energy diagram of the junction area is illustrated in FIG. 5. The lower bandgap material, GaAs, has a bandgap energy on the order of 1.4 eV. If the junction is considered in isolation, this would result in a turn-on voltage even greater than for the InGaAs mentioned above.

The case of a heterojunction laser is illustrated in the energy diagram of FIG. 6. An n-type active region 4 such as GaAs is formed between a p+ cladding layer 6 on one side and an n-type cladding layer 8 on the other side; both cladding layers are typically AlGaAs. The device is normally operated forward-biased, which causes electrons to be pumped from the cladding layer 8 into the active region 4 and holes to be pumped from the other cladding layer 6 into the active region 4. The electrons 10 and holes 12 are confined within the active region by the energy barriers on either side, and eventually combine to emit light. As with the other heterojunction devices described above, the pn junction between the cladding layer 6 and active region 4 would not exhibit a low forward-bias turn-on voltage, due to the relatively wide bandgap energy (about 0.7 eV) of the GaAs which is required for lattice-matching with the cladding layers.

SUMMARY OF THE INVENTION

The present invention seeks to provide a new type of heterojunction diode that exhibits a lower forward-bias turn-on voltage than previously available diodes, and additionally offers higher operating speed.

Such a diode is obtained by growing a layer of semiconductor material with a narrow bandgap energy, preferably less than about 0.4 eV, upon a layer of oppositely doped semiconductor material that has a substantially wider bandgap energy, with a heterojunction formed between the two. The higher bandgap material is grown upon a substrate with which it is lattice-matched. However, the narrow bandgap material can have a substantial lattice mismatch with the wider bandgap material, and can exhibit a substantial density of lattice dislocations that are normally deliberately avoided in heterojunction devices. By forming a contact to the narrow bandgap material, rather than growing other semiconductor material on it, the narrow bandgap material in essence functions as an electrode without significant impairment by its dislocations.

In the preferred embodiment, the narrow and wider bandgap materials are selected so that the valence and conduction band edge discontinuities at the heterojunction enable a forward carrier flow but block a reverse carrier flow across the junction under forward-bias conditions; the narrow bandgap material is doped n-type and exhibits substantially no surface pinning of its Fermi energy level, and the wider bandgap material is doped p-type. The two materials are preferably selected so that holes are the dominant conduction mechanism across the heterojunction under forward-bias conditions. Preferred material systems are InAs for the narrow bandgap material with InGaAs for the wider bandgap material and InP for the substrate, or AlSb for the wider bandgap material and GaSb for the substrate.

Further improvements in the turn-on voltage level are obtained by grading the heterojunction over a defined width between the narrow and wider bandgap materials. The wider bandgap material also preferably includes a region of relatively low dopant concentration, which increases the diode's reverse-bias breakdown voltage, along with a region of relatively higher dopant concentration that functions as a charge carrier source.

With holes as the dominant charge flow mechanism, electrons from the narrow bandgap material are reflected at the heterojunction and prevented from flowing into the wider bandgap material under forward-bias. The result is that electrons do not need to be removed from the wider bandgap material when the bias is reversed, which yields a rapid switching capability in addition to the low turn-on voltage.

These and further features and advantages of the invention will be apparent to those skilled in the art from the following detailed description, taken together with the accompanying drawings.

BRIEF DESCRIPTION OF THE DRAWINGS

FIGS. 4, 5 and 6 are energy diagrams showing the pn junction portions of a known HJFET, staircase APD and laser, respectively;

FIG. 7 is an enlarged sectional view illustrating the structure of a diode formed in accordance with the invention;

DETAILED DESCRIPTION OF THE INVENTION

Figure 1:
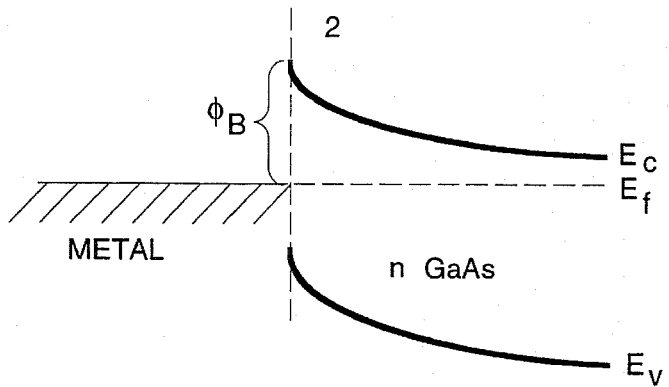
FIGS. 1 and 2 are energy diagrams of a known Schottky diode and the emitter-base portion of an HBT, respectively.
Figure 2:
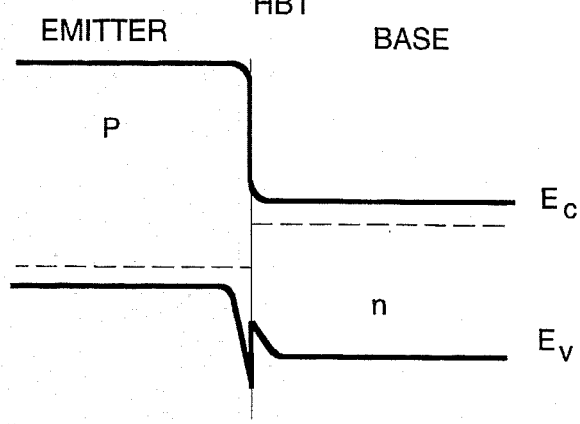
Figure 3:
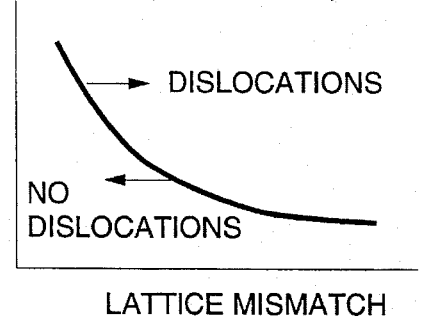
FIG. 3 is a curve illustrating the dependence of lattice dislocation formation upon both the degree of lattice mismatch between two semiconductor materials, and the thickness of the semiconductor that is grown upon the other semiconductor.
Figure 4:
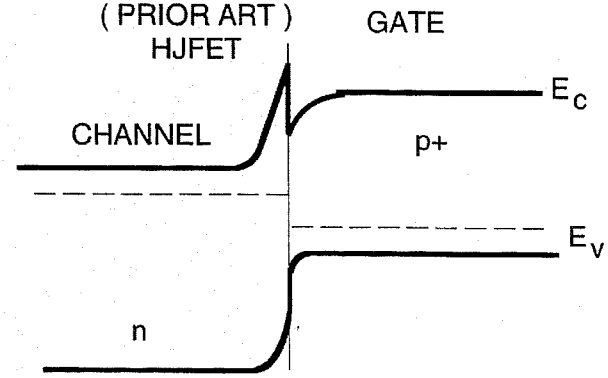
Figure 5:
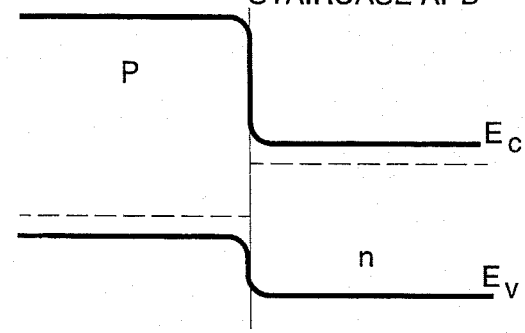

In its preferred embodiment, the present invention implements a low turn-on voltage, high speed diode with a heterostructure that violates the fabrication rules of previous heterostructure devices by deliberately establishing a lattice mismatch across a heterojunction; the mismatch is sufficient to produce a significant concentration of lattice dislocations (crystalline defects) in a couple tens of nanometers thickness. Despite this unusual procedure, the device has been found to have a better combination of low turn-on voltage and high speed than has previously been achieved, and is also capable of a high reverse-bias breakdown voltage. As illustrated in FIG. 7, the device is grown upon a semiconductor substrate 14, preferably InP. The substrate can either be highly doped p+ and thereby function as the anode contact for the diode, or it may be semi-insulating to isolate different devices from each other on this substrate.

A semiconductor material that is lattice matched with the substrate, preferably InGaAs, is grown over the substrate to function as the anode. As illustrated in FIG. 7, the anode is preferably divided into a first section 16 adjacent the substrate that is doped p+ to a concentration on the order of $10^{19}/cm^3$ to provide a source of majority (hole) charge carriers, and a second section 18 that has a lower p dopant concentration, such as $10^{17}/cm^3$, to reduce the device's reverse-bias breakdown voltage level. Typical thicknesses for the anode sections 16 and 18 are 500 nm and 250 nm, respectively, although these can vary widely. The specific anode structure is preferably $In_{0.53}Ga_{0.47}As$, whose lattice constant is 5.86875, the same as the InP substrate. A substantially perfect lattice matching between the substrate and anode is thus achieved. While some degree of lattice mismatch can be tolerated, it should be small enough to avoid any significant concentration of dislocations in the anode lattice. The anode is preferably grown by molecular beam epitaxy (MBE), although other processes such as metal organic chemical vapor deposition (MOCVD), vapor phase epitaxy (VPE) or gas source molecular beam epitaxy (GSMBE) could also be used.

A relatively thin n+ cathode layer 20 is epitaxially grown over the anode material. The cathode material 20 can be grown with an abrupt junction between it and the anode, but preferably the junction is compositionally graded along a gradient width 22 between the two materials. The compositional grading can be established during the MBE process by simply closing the shutter over the anode material gradually as the shutter over the cathode material is opened. Alternately, a superlattice could be formed in which the proportion of anode material decreases while the proportion of cathode material increases within each superlattice period from the anode to the cathode. Electrical contact to the cathode can be established with a conventional contact metallization 24. The cathode thickness is preferably on the order of about 25 nm; although this can be increased up to several hundred nm, there is no particular benefit in doing so. The minimum thickness for the cathode is on the order of at least several nm, which is necessary to establish a cathode region beyond the depletion region at the junction. Conventional doping techniques can be used, typically involving Si for n doping and Be for p doping.

The cathode material 20 is selected to have a low bandgap energy, which results in a low forward-bias turn-on voltage for the overall diode. For the particular material system in this embodiment, the preferred cathode material is InAs with an n+ doping concentration of about $10^{19}cm^3$. The $E_g$ of InAs is about 0.3 eV, which has been found to result in diodes with a lower turn-on voltage than any prior devices. However, InAs has a lattice constant of 6.0584, which represents a slightly greater than 3% mismatch with InP and $In_{0.53}Ga_{0.47}As$. With a preferred cathode thickness of about 25 nm, this mismatch results in a significant degradation in the cathode's crystalline quality, with a substantial formation of lattice dislocations; lattice strain occurs after only a few monolayers of InAs growth. However, the presence of these lattice defects did not appear to degrade the operation of the device as a diode.

Figure 8:
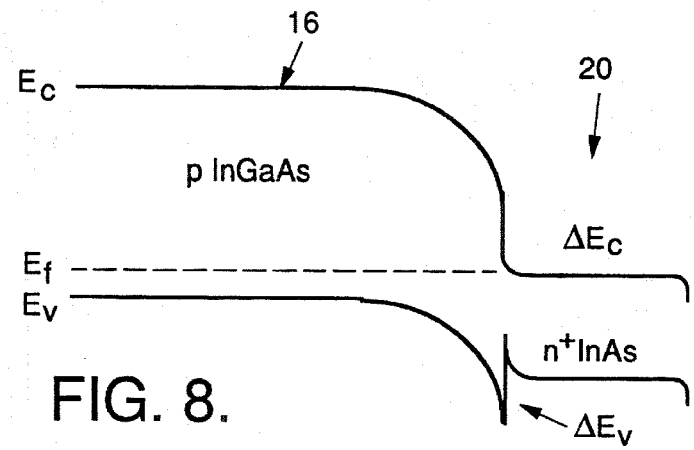
FIGS. 8 and 9 are energy diagrams of a diode according to the invention, respectively with no junction bias and with a forward-bias.
Figure 9:
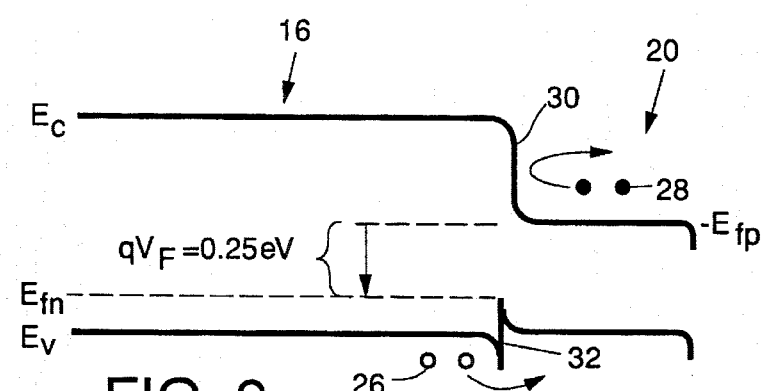

Energy diagrams of the heterojunction region in the new diode are illustrated in FIGS. 8 and 9 at zero bias and a forward-bias of approximately 0.25 V, respectively. The conduction and valence band edge discontinuities, shown in the figure as $\Delta E_c$ and $\Delta E_v$, are important to the operation of the diode. The diode will turn on when it is biased such that the holes in the InGaAs valence band are at approximately the same energy as the valence band of the n+ InAs. At this level of forward-bias the holes 26 flow from the InGaAs anode into the InAs cathode. At the same forward-bias, the electrons 28 in the conduction band of the InAs cathode try to move toward the InGaAs anode, but are repelled by the approximately 0.4 V barrier 30 at the heterojunction. Thus, holes are the dominant charge carriers, and the minority electron carriers do not play a role in the device's high speed operation, much like Schottky barrier diodes.

The diode's forward turn-on characteristics are determined principally by the bandgap of the narrow band InAs cathode material, and to a lesser extent by its valence band spike 32. The compositional grading region 22 (FIG. 7) reduces this spike in the valence band, and thus reduces the turn-on voltage. The reverse-bias breakdown voltage is determined by impact ionization in the p-type GaInAs, which in turn depends upon the p-type doping density.

Abrupt and graded junction versions of the new diode were grown for demonstration purposes, and compared with homojunction n+/p InGaAs/InGaAs diode junctions previously used in high speed pnp HBTs, with a current concentration of 10 $A/cm^2$ in all cases. The homojunction device had a turn-on voltage of 0.44 V, as compared to 0.23 V for the new diode with an abrupt junction. The turn-on voltage for the new diode was further reduced to 0.18 V when a graded junction over a width of 10 nm was introduced, and even this extremely low turn-on voltage was reduced to 0.16 V with a 5 nm graded junction period.

Figure 10:
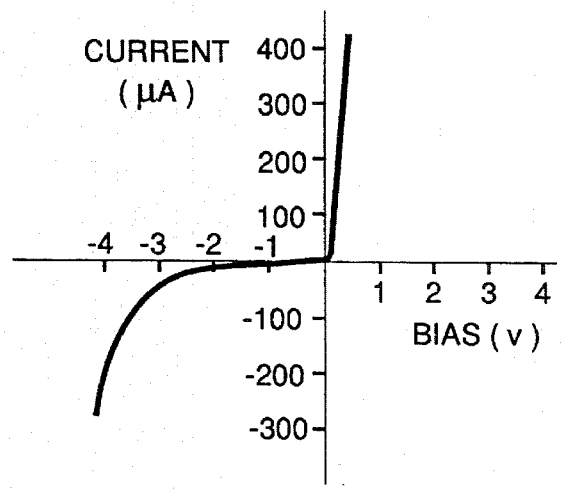
FIGS. 10 and 11 are current-voltage diagrams illustrating the low forward-bias turn-on voltage and high reverse-bias breakdown voltage achieved with the invention.
Figure 11:
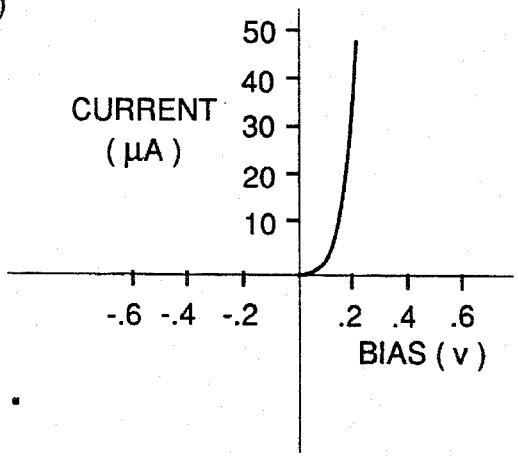

Typical current-voltage curves for the heterojunction diodes are shown in FIGS. 10 and 11, for the case of a compositional grading over 10 nm at the junction and a diode area of 100 $microns^2$. FIG. 10 has a larger scale and shows that reverse breakdown occurred at −2.7 V at −10 $A/cm^2$, while FIG. 11 has a finer scale and illustrates the forward turn-on voltage of 0.18 V. The demonstration devices were not optimized to minimize series resistance, and thus larger than necessary voltages were obtained at high current densities. A thicker p+ layer 16 could be used to resolve the series resistance limitation. The reverse breakdown voltage of −2.7 V compares with −7.4 V for the homojunction diodes; a thicker p-type InGaAs region with a slightly lower doping could be used to increase the breakdown voltage.

While InP/InGaAs/InAs is a preferred material system at the present time, the invention is not limited to this particular system; other materials, particularly III-V combinations, can be considered. The general requirements of the invention for any material system are:

1) The cathode should exhibit a very narrow bandgap energy, to provide a low forward-bias turn-on voltage. Lattice matching between the cathode and anode is not critical.

2) The anode region should be at least approximately lattice matched with the substrate, and should have a substantially wider bandgap energy than the cathode to provide a high reverse-bias breakdown voltage.

3) The band edge discontinuity should be low for whichever band dominates the conduction mechanism. For hole conduction, the valence band edge discontinuity should be small; for electron conduction the conduction band edge discontinuity should be small. Larger band edge discontinuities increase the size of the spike at the junction, which increases the turn-on voltage for an abrupt junction. While the spike can be reduced by compositional grading, it is difficult to eliminate entirely.

4) The cathode material should preferably have zero or only a small degree of surface pinning of its Fermi level. Pinning of the Fermi level bends the Fermi band up at the surface, and adds to the voltage barrier for turn-on. GaAs, AlGaAs and InP exhibit surface pinning of their Fermi levels, and thus are not good candidates for the cathode (in addition to their relatively high bandgap energies), whereas InAs does not exhibit surface Fermi pinning.

Other potential material systems include a GaSb substrate, GaSb anode and InSb or InAsSb cathode, and a GaSb substrate, AlSb anode and InAs cathode. The latter system is of particular interest, since it would exhibit the same turn-on voltage as the compositionally graded heterojunction InP/InGaAs/InAs system, but does so without compositional grading. Since the energy bands of AlSb and InAs are closely aligned, there is little or no spiking at the junction, and thus no need for compositional grading. Furthermore, there is a closer lattice match between a GaSb substrate and AlSb anode than between InP and most compositions of InGaAs, and AlSb has a wider bandgap energy that will yield higher reverse-bias breakdown voltage levels.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A diode with a low forward-bias turn-on voltage, comprising:

a layer of n-doped semiconductor material having a narrow bandgap energy of not more than about 0.4 eV, a layer of p-doped semiconductor material having a substantially wider bandgap energy than said narrow bandgap material and forming a pn heterojunction therewith, said n-doped material having a valence band energy and a conduction band energy that are less than the valence band and conduction band energies, respectively, of said p-doped material by respective valence band and conduction band discontinuities when said heterojunction is unbiased, the unbiased valence band discontinuity being substantially less than the unbiased conduction band discontinuity, said materials responding to a forward bias across said heterojunction by reducing said valence band discontinuity to enable a substantial valence band hole flow across said heterojunction, and by maintaining said conduction band discontinuity at a level that is high enough to substantially block conduction band electron flow across said heterojunction, and respective electrical contacts to said narrow and wider bandgap materials for establishing a diode action by applying a bias across said pn heterojunction.

2. The diode of claim 1, wherein said narrow bandgap material has a substantial lattice mismatch with said wider bandgap material and includes substantial lattice dislocations.

3. The diode of claim 1, wherein said narrow bandgap material is selected to exhibit substantially no surface pinning of its Fermi energy level.

4. The diode of claim 3, wherein said narrow bandgap material comprises InAs.

5. The diode of claim 4, wherein said wider bandgap material comprises InGaAs.

6. The diode of claim 4, wherein said wider bandgap material comprises AlSb.

7. The diode of claim 1, wherein said heterojunction is graded between said narrow bandgap and said wider bandgap materials.

8. The diode of claim 1, said wider bandgap material including a region of relatively low dopant concentration to increase the diode's reverse-bias breakdown voltage, and a region of relatively higher dopant concentration to act as a charge carrier source.

9. A diode with a low forward-bias turn-on voltage, comprising:

a semi-insulating semiconductor substrate, a layer of doped semiconductor material having a relatively wide bandgap energy formed on said substrate and at least approximately lattice matched therewith, and a layer of oppositely doped semiconductor material having a substantially narrower bandgap energy than said wide bandgap material formed on said wide bandgap material and establishing a heterojunction therewith, said narrower bandgap material having a substantial lattice mismatch with said wide bandgap material and being characterized by substantial lattice dislocations, said wide and narrower bandgap materials establishing valence band and conductive band discontinuities in the same direction across said heterojunction.

10. The diode of claim 9, wherein said wide and narrower bandgap materials are selected so that the valence band edge discontinuity at said heterojunction is small relative to said narrower bandgap energy in the case of a narrower bandgap material whose dominant charge carriers are holes, and so that the conduction band edge discontinuity at said heterojunction is small relative to said narrower bandgap energy in the case of a narrower bandgap material whose dominant charge carriers are electrons.

11. The diode of claim 10, wherein said wide and narrower bandgap materials are selected so that, for a small valence or conduction band edge discontinuity, the other of the band edge discontinuities is substantially larger to inhibit minority charge carrier flow across said heterojunction under forward bias conditions.

12. The diode of claim 9, wherein the bandgap energy of said narrower bandgap material is not more than about 0.4 eV.

13. The diode of claim 9, wherein said narrower bandgap material is selected to exhibit substantially no surface pinning of its Fermi energy level.

14. The diode of claim 9, wherein said narrower bandgap material is doped n type, said wide bandgap material is doped p type, and said materials are selected so that holes are the dominant conduction mechanism across said heterojunction under forward bias conditions.

15. The diode of claim 14, wherein said narrower bandgap material comprises InAs.

16. The diode of claim 15, wherein said wide bandgap material comprises InGaAs.

17. The diode of claim 16, wherein said substrate comprises InP.

18. The diode of claim 15, wherein said wide bandgap material comprises AlSb.

19. The diode of claim 18, wherein said substrate comprises GaSb.

20. The diode of claim 9, wherein said heterojunction is graded between said narrower bandgap and wide bandgap materials.

21. The diode of claim 9, said wide bandgap material including a region of relatively low dopant concentration to increase the diode's reverse-bias breakdown voltage, and a region of relatively higher dopant concentration to act as a charge carrier source.

* * * * *